METHOD FOR DIFFUSING ACTIVE IMPURITIES INTO SEMICONDUCTOR MATERIALS

Filed Aug. 6, 1956

THOMAS C. HALL,
CLIFFORD A. LEVI,
INVENTORS.

By Martin R. Horn

ATTORNEY.

United States Patent Office 2,827,403
Patented Mar. 18, 1958

2,827,403

METHOD FOR DIFFUSING ACTIVE IMPURITIES INTO SEMICONDUCTOR MATERIALS

Thomas C. Hall, Playa Del Rey, and Clifford A. Levi, North Hollywood, Calif., assignors to Pacific Semiconductors, Inc., Culver City, Calif., a corporation of Delaware Application August 6, 1956, Serial No. 602,354

12 Claims. (Cl. 148—1.5)

This invention relates to junction-type semiconductor devices and more particularly to a new method for producing the same.

In the semiconductor art, a region of semiconductor material containing an excess of donor impurities and having an excess of free electrons is considered to be an N-type region, while a P-type region is one containing an excess of acceptor impurities resulting in a deficit of electrons, or stated differently, an excess of holes. When a continuous solid specimen of crystal semiconductor material has an N-type region adjacent to a P-type region, the boundary between them is termed a P–N (or N–P) junction, and the specimen of semiconductor material is termed a P–N junction semiconductor device. A specimen having two N-type regions separated by a P-type region, for example, is termed an N–P–N junction semiconductor device, or transistor, while a specimen having two P-type regions separated by an N-type region is termed a P–N–P junction semiconductor device or transistor.

These P–N or N–P junctions are hereinafter referred to as rectifying junctions or simply as junctions. It is often desirable to provide a non-rectifying junction or ohmic contact to a semiconductor material. The method of the present invention is particularly adapted to the production of both rectifying and non-rectifying junctions by the phenomenon of diffusion of active impurity atoms into the semiconductor starting crystal. The method of the present invention further lends itself to the diffusion of atoms of trapping site impurities into semiconductor materials. Examples of such trapping site impurities are nickel, copper, tin, lithium, etc. A more complete discussion of these trapping site impurities may be found in an article entitled "Impurity centers in Ge and Si," by J. A. Burton, published in Physica, volume 20, pp. 845–854, November 1954. When a P-type starting crystal such as silicon, for example, of a given resistivity has acceptor impurity atoms diffused therein, a diffused P-type region of a different resistivity is produced. The gradation between these two regions is what has herein been termed a non-rectifying junction and may be useful in producing an ohmic contact. The term junction, therefore, for the purposes of this invention, is intended to include both rectifying and non-rectifying junctions. The term P–P+ junction or N–N+ junction is typically used to denote a non-rectifying junction depending upon whether it is made to a P-type conductivity or N-type conductivity crystal.

The term semiconductor material as utilized herein is considered generic to germanium, silicon, and germanium-silicon alloy, and is employed to distinguish these semiconductors from metallic oxide semiconductors such as copper oxide, and other semiconductors consisting essentially of chemical compounds.

The term active impurity is used to denote those impurities which affect the electrical rectification characteristics of semiconductor materials as distinguished from other impurities which have no appreciable effect upon these characteristics. Active impurities are ordinarily classified as donor impurities such as phosphorus, arsenic, and antimony, or acceptor impurities such as boron, aluminum, gallium, and indium.

Trapping site impurities as discussed hereinbefore are also intended, for the purpose of this invention, to be included within the definition of the term active impurities.

In the prior art, P–N junction devices have been produced by fusing small amounts of a low melting point active impurity within a portion of a semiconductor starting specimen. According to this prior art method, a predetermined amount of low melting point active impurity, such as indium, for example, is placed in contact with the surface of an N-type germanium specimen. The specimen and the contacting indium are then heated to a value of temperature above the melting point of the indium, but below the melting point of the germanium specimen or crystal in order to melt the indium and dissolve therein a portion of the adjacent germanium. The specimen is then cooled so that the dissolved atoms of germanium and indium are regrown onto the specimen, thereby producing an indium-saturated P-type region in the semiconductor specimen.

Another prior art method for producing junction devices is the diffusion technique. Diffused as opposed to regrown junctions are often desirable because of the variety of electrical characteristics which are manifested by a diode or transistor produced by such a technique. In the prior art, regrown and diffused junction methods, however, had been difficult to control.

Germanium and especially silicon have an inherent tendency toward the rapid formation of hard and stable oxide layers on their surfaces. Therefore, it is difficult for the active impurity employed in the fusion or diffusion process to wet the adjacent surface of the crystal. Further, it is difficult to produce, according to prior art methods, a good ohmic electrical connection to silicon. The more conventional techniques employed for producing ohmic contacts to germanium have been found unsatisfactory when applied to silicon devices. With such methods, there has been found a tendency for the contacts so manufactured to be of a relatively high electrical impedance which, in many instances, exhibit asymmetrical conductivity.

Accordingly, in the hereinabove described methods for producing a diffused junction in a semiconductor starting crystal and more particularly in a silicon starting crystal, it is typically required that a chemically non-oxidizing or reducing atmosphere be provided in the immediate vicinity of the junction area. This has heretofore been extremely difficult to achieve in a practical production technique.

Another disadvantage inherent in the above referred to method is that they only permit the production of small area junctions.

The method of the present invention, on the other hand, overcomes the above and other difficulties which have heretofore limited the use of silicon and often germanium and further provides diffused junction silicon and germanium semiconductor devices which exhibit outstanding electrical characteristics.

According to the basic concept of the present invention, methods are disclosed for producing a non-rectifying low-impedance electrical connection to a semiconductor starting crystal and also for creating rectifying junctions within the crystal, as well as producing trapping sites by diffusing thereon an active impurity from a hydride or hydride salt.

More particularly, according to the preferred embodiment of the present invention, diffusion of an active impurity into silicon is achieved by placing a silicon starting crystal into a quartz tube, introducing an alkali hydride, such as potassium borohydride, sealing the tube after evacuating the same, and heating it to a value of temperature above the decomposition temperature of the borohydride, but below the melting point of silicon.

Accordingly, it is an object the present invention to provide a new method for diffusing active impurity elements into semiconductor materials.

A further object of the present invention is to provide a new method for producing large area junction semiconductor devices.

A still further object of the invention is to provide a method for producing simultaneously two junctions in a semiconductor starting crystal.

Yet another object of the invention is to provide a new method for producing trapping sites in a semiconductor starting crystal.

The novel features which are believed to the characteristic of the present invention, both as to its organization and method of operation, together with other objects and advantages thereof, will be better understood from the following description considered in connection with the accompanying drawing in which two embodiments of the invention are illustrated by way of example. It is to be expressly understood, however, that the drawing is for the purpose of illustration and description only, and is not intended as a definition of the limits of the invention.

Figure 1:
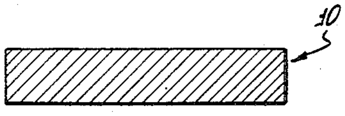
Figure 1 is a cross sectional view of a semiconductor wafer which is to be processed according to the method of the present invention.

Referring now to the drawing, there is shown in Figure 1 a cross sectional view of semiconductor crystal wafer 10 which may be of either N or P-type conductivity and may be germanium, silicon, or germanium-silicon alloy. For the purpose of clarity and simplicity of explanation, it will hereafter be assumed that the semiconductor starting crystal 10 is of N-type conductivity silicon, unless otherwise indicated.

Figure 2:
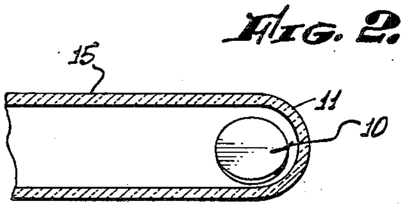
Figure 2 shows how the wafer of Figure 1 might be placed in a container during an intermediate step in the process of the present invention.

According to the preferred embodiment of the method of the present invention, silicon crystal 10 is placed within container 11, as shown in Figure 2, which may be of quartz glass or perhaps molybdenum. The only requirements for the container 11 in this embodiment are that it be non-porous, be able to withstand a temperature of at least 1250° C., and be able to be sealed off from the atmosphere and be chemically inert. While in Figure 2 only one crystal wafer is shown, it is to be expressly understood that several may be simultaneously processed. In fact, it has been found that six is an ideal number in a quartz tube having the following parameters: four inches long, 20 mm. inside diameter, and a volume of 20 cc.

Figure 3:
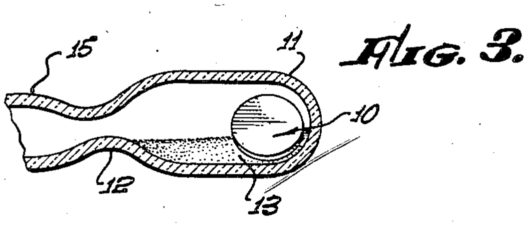
Figure 3 shows how, according to the preferred embodiment of this invention, the container of Figure 2 would appear in a subsequent stage of production.

After being loaded with wafer 10, the tube is necked down, as shown in Figure 3, by a heating and drawing technique, for example, if it be of quartz. Neck region 12 may have an inside diameter of approximately 2 mm. Then an active impurity bearing compound 13 is introduced into tube 11. Any active impurity bearing hydride or hydride salt may be used. Among those which have been advantageously used are sodium borohydride and potassium borohydride, however it is not intended that this invention be limited to the use of alkali salts as other non-alkali salts are also applicable. In a tube having the above referred dimensions, 28 mg. of potassium borohydride has been found to be satisfactory to produce diffusions in six crystals housed within tube 11 while maintaining the internal pressure sufficient to prevent tube collapse at elevated temperature of diffusion. The impurity bearing compound 13 may be in liquid, gaseous, or solid form. The only limitation imposed is that it be a hydride or a hydride salt so that a self-producing reducing atmosphere may be achieved during the diffusion step.

It is preferable to neck tube 11 prior to the introduction of compound 13 because the relatively high heat required to partially melt tube 11 at 12 would serve to deleteriously affect the active impurity bearing compound 13.

After the active impurity bearing compound 13 has been introduced into tube 11, the tube is evacuated by a vacuum pumping apparatus. One such apparatus which has been found to be extremely satisfactory is a diffusion pump. It has been found that after one hour of pumping, a satisfactory vacuum of approximately 0.0001 mm. of Hg is achieved in a tube of the dimension above disclosed.

Figure 4:
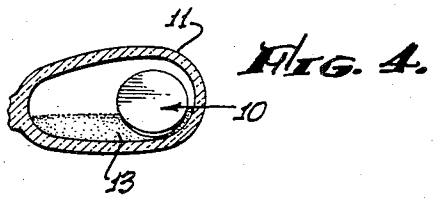
Figure 4 shows how the container of Figure 2 would appear after being sealed off from the atmosphere.

Subsequent to the vacuum pumping operation, the tube 11 is sealed off at 12 with the section 15 being discarded. The enclosed tube 11, as shown in Figure 4, is then completely airtight and has an internal air pressure of approximately 0.1 micron of Hg.

Next enclosed tube 11 is placed into an oven, not shown, and heated to a value of temperature within the range above the decomposition temperature of the compound 13, but below the melting point of the crystal 10. In the example wherein potassium borohydride is used as the compound and silicon as the semiconductor crystal, the temperature range might be between approximately 800° and 1250° C. which is below the temperature at which a molten phase forms. The temperature of the oven is slowly brought up to its desired maximum to permit prolonged exposure of the crystal 10 to the decomposition products of the compound 13. Of course, the upper temperature limit, the rate at which the temperature is raised, and the period of time during which it is to be maintained depend upon the depth of diffusion desired and the desired electrical characteristics required of the completed semiconductor device.

In one example a silicon diode was produced under the following conditions. An N-type silicon wafer of approximately 10 ohm centimeters resistivity was placed in a quartz tube with the hereinbefore stated parameters. After introducing 28 mg. of potassium borohydride, the tube was placed in an oven whose temperature was uniformly raised from room temperature to 500° C. during a sixty minute period. At this temperature of 500° C., the $KBH_4$ broke down to form $K+B_2H_6+H_2$. During the next hour, the temperature was uniformly raised to 800° C. at which temperature the $B_2H_6$ decomposed, the chemical reaction being represented as $$B_2H_6 \rightarrow 2B+3H_2$$

to produce pure boron.

Finally, during the third hour, the temperature was again uniformly increased from 800° C. to 1250° C. during which time it can be said that the diffusion of the boron into the silicon took place.

Thereafter electrical contacts were produced by methods well known to the art. A typical diode so produced exhibited the following electrical characteristics:

Recovery time—0.20 $\mu$ sec. to 80K.
$E_s$—500 volts
$E_t$—495 volts
$I_B$ at −100 volts—0.010 microampere
$I_F$ at +1 volt—100 milliamperes.

Figure 5:
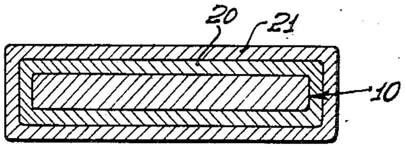
Figure 5 is a cross sectional view showing how the wafer of Figure 1 would appear after being processed according to the method of the present invention.

During the heating cycle the following phenomena are thought to take place. When the temperature reaches between 500°–800° C., the $B_2H$ breaks down to form $2B+3H_2$. The elemental boron will then deposit out as a solid upon the surface of crystal 10. And as the temperature is raised still higher, i. e., between 800–1250° C., for example, the boron atoms will diffuse into the silicon to form P-type conductivity region 20 within crystal 10 as shown in Figure 5. After the desired penetration of P-type region 20 is achieved the temperature of the furnace is slowly brought down to room temperature. As the crystal cools, a region of boron-silicon complex compound will form around P-type region 20 as may be seen in Figure 5.

Thereafter, the tube 11 is opened and the crystal 10 removed. It should be pointed out that ordinarily, when a quartz glass container or tube 11 is used, it is desirable to introduce that amount of $KBH_4$ or other impurity bearing compound 13 which will release an amount of $H_2$ gas at 1250° (or other upper temperature limit depending upon the compound, crystal material, and the like), as to create a pressure of approximately one atmosphere within tube 11. This procedure minimizes the likelihood of a resulting break in glass tube 11 due to mechanical stresses which would otherwise exist by virtue of the pressure gradient between the inside and the outside of tube 11. This consideration is fairly significant in view of the fact that the mechanical strength of quartz glass at high temperatures such as 1250° C. is greatly reduced.

One inherently advantageous feature of the present invention is the fact that the entire diffusion process takes place in a reducing atmosphere. In the embodiment above described, in fact, hydrogen gas which is a reducing agent, is produced by the active impurity bearing compound 13. The advantages of performing the diffusion operation in a reducing atmosphere are many. In order to better appreciate the advantages, let us consider the alternatives which are either a vacuum or an oxidizing atmosphere.

A vacuum would be unsatisfactory for the following reasons. As was pointed out hereinbefore, the quartz glass tube becomes structurally weak at the high temperature necessary during diffusion. Since the oven is at atomspheric pressure, and the interior of the tube at a pressure near zero, the pressure differential may cause the tube to collapse. Further, it is inherently difficult, cumbersome, and expensive to produce a vacuum sufficiently devoid of contaminants such as oxygen. What is more, in a vacuum, heated silicon has a tendency to vaporize at the surface resulting in erosion of the silicon starting crystal.

The chief and obvious disadvantage of performing the diffusion in an ambient atmosphere is the fact that silicon has a great affinity for oxygen, especially upon being heated. A silicon dioxide coating, which forms on the surface of the starting crystal, will not permit the deposited boron to wet the surface of the silicon which is necessary before diffusion can take place.

Figure 6:
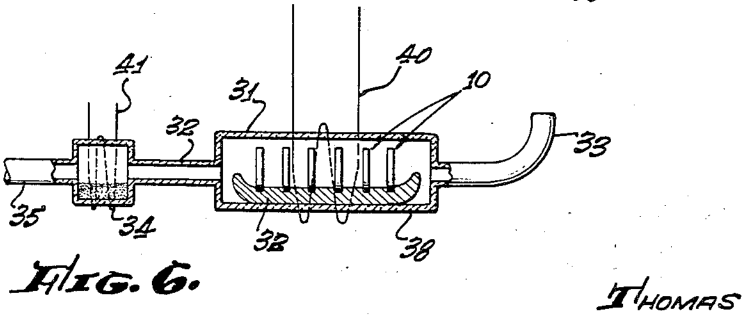
Figure 6 is a view of an arrangement showing how the method of the present invention might be practiced according to the "open tube" method.

Referring now to Figure 6, therein is shown an alternate arrangement by which the method of the present invention might be carried out. This alternate arrangement typifies the so-called open tube method, while what has hereinabove been described was the so-called closed tube method.

A container on tube 31 which, as tube 11, may be made of quartz or the like, has an inlet and an outlet stem 32 and 33, respectively. To the left of inlet stem 32 is an enlarged portion 34, which is connected through its inlet 35 to a source of gas not shown. The central portion 38 of tube 31 and portion 34 thereof are each surrounded by a heating coil numbered 40 and 41, respectively.

In practicing the method of the present invention according to this closed tube embodiment, the semiconductor crystal body is placed within container 31 within portion 38. The active impurity bearing compound 13 is placed within portion 34 of tube 31 thereafter. Portion 38 of tube 31 is then heated to the temperature at which it is desired that diffusion into crystal 10 take place, i. e., 1250° C. by energizing heating coil 40 by a source of voltage not shown.

Then portion 34 is heated to a value of temperature above the decomposition temperature of impurity bearing compound 13, i. e., 500–800° C. for potassium borohydride by energizing heating coil 41 by a source of voltage not shown.

After both portions 38 and 34 have been brought to temperature, a non-oxidizing gas such as nitrogen, hydrogen, argon, helium, or the like is injected under a slight pressure into inlet 35. The gas is preheated to a value of temperature substantially equal to that maintained at portion 34 to avoid mechanical stresses due to a difference in temperature. The gas as it sweeps through portion 34 into portion 38 will carry with it some of the boron atoms released from the potassium borohydride and which will penetrate crystal 10 due to diffusion.

Diffusion will then take place in much the same manner as in the closed tube method resulting in a crystal as shown in Figure 5.

Of course, it is understood that any active impurity bearing hydride or hydride salt compound may be employed in this closed tube embodiment as was explained with respect to the closed tube method.

The method of the present invention has been described with N-type conductivity silicon as the starting material and potassium borohydride as the active impurity source from which boron atoms are diffused into the N-type silicon to connect a region thereof to P-type conductivity resulting in a P–N junction at the interface. As has already been stated, the starting crystal could very well be germanium or germanium-silicon alloy and could also alternatively be of P-type conductivity if an ohmic contact is desired.

There has thus been disclosed a new method for producing rectifying and non-rectifying junctions, as well as trapping sites in semiconductor materials by diffusion of active impurities in the nonoxidizng atmosphere which lends itself to ease of manufacture and permits careful control.

What is claimed as new is:

1. In the production of a silicon semiconductor electrical translating device, the method of producing a junction by diffusing atoms of an active impurity into a silicon semiconductor crystal of a predetermined conductivity type including the steps of: placing the semiconductor crystal and an active impurity bearing compound selected from the group consisting of hydrides and hydride salts into a container; evacuating said container; sealing said container from the atmosphere; and heating said container to a value of temperature above the decomposition tempearture of said compound and below the temperature at which a molten phase forms and below the melting point of said crystal, whereby hydrogen gas and the active impurity from said compound are released from said compound thereby providing an active impurity source and means for transporting the active impurity to the surface of said crystal for diffusion into said crystal in a reducing atmosphere.

2. The method of diffusing atoms of an active impurity into a silicon semiconductor crystal of a predetermined conductivity type to produce a junction silicon semiconductor electrical translating device including the steps of: placing the semiconductor into an evacuated container; placing an active impurity bearing compound selected from the group consisting of hydrides and hydride salts into said container; evacuating said container; sealing said container from the atmosphere; and heating said container to a value of temperature above the decomposition temperature of said compound and below the temperature at which a molten phase forms and below the melting point of said crystal, whereby hydrogen gas and the active impurity from said compound are released from said compound thereby providing an active impurity source and means for transporting the active impurity to the surface of said crystal for diffusion into said crystal in a reducing atmosphere.

3. In the production of a silicon semiconductor electrical translating device, the method of producing a junction therein by diffusing atoms of an active impurity into a silicon semiconductor crystal of a predetermined conductivity type including the steps of: placing the silicon semiconductor crystal and an active impurity bearing compound selected from the group consisting of hydrides and hydride salts into a container; producing a partial vacuum within said container; sealing off said container from the atmosphere; and heating said container to a value of temperature within the range above the decomposition temperature of said compound and below the temperature at which a molten phase forms, and below the melting point of said crystal, whereby hydrogen gas and the active impurity from said compound are released from said compound thereby providing an active impurity source and means for transporting the active impurity to the surface of said crystal for difffusion into said crystal in a reducing atmosphere.

4. The method of producing an ohmic contact to a P-type conductivity portion of semiconductor silicon electrical translating device by diffusing atoms of an acceptor impurity into said portion, said method including the steps of: placing the elecrical translating device and an acceptor impurity bearing compound selected from the group consisting of hydrides and hydride salts into a container; evacuating said container; sealing said container from the atmosphere; and heating said container to a value of temperature above the decomposition temperature of said compound and below the temperature at which a molten phase forms and below the melting point of said silicon to permit some of the acceptor impurity atoms from said compound to deposit upon and diffuse into said portion, whereby hydrogen gas and said acceptor impurity are released from said compound thereby providing an active impurity source and means for transporting the active imnurity to the surface of said portion of said device for diffusion therein in a hydrogen atmosphere.

5. The method of producing a junction in a silicon semiconductor crystal device of a predetermined conductivity type by diffusing atoms of boron into said crystal including the steps of: placing the semiconductor crystal and a boron bearing compound selected from the group consisting of borohydrides and borohydride salts into a container; evacuating said container; sealing said container from the atmosphere; and heating said container to a value of temperature above the decomposition temperature of said compound and below the temperature at which a molten phase forms and below the melting point of said silicon whereby hydrogen gas and boron are released from said compound thereby providing an acceptor impurity source and means for transporting the impurity to the surface of said crystal for diffusion into said crystal in a reducing atmosphere.

6. The method of producing an integral ohmic contact to a P-type silicon conductivity semiconductor crystal device by diffusing atoms of boron into said crystal, said method including the steps of: placing the starting crystal and a small quantity of a borohydride salt into a quartz tube; evacuating said tube; sealing said tube from the atmosphere and heating said tube to a value of temperature above the decomposition temperature of said salt and below the temperature at which a molten phase forms, and below the melting point of silicon to permit some of the boron atoms from said salt to be transported to the surface of said crystal and deposit upon and diffuse into said crystal in a hydrogen atmosphere a sufficient distance therein in a sufficient quantity to effect the establishment of an integral ohmic contact.

7. The method of producing a P–N junction in an N-type conductivity silicon semiconductor starting crystal device by diffusing atoms of boron into said crystal, said method including the steps of: placing the semiconductor crystal and a borohydride salt into a quartz tube; evacuating said tube; sealing said tube from the atmosphere; and heating said tube to a value of temperature within the range above the decomposition temperature of said salt and below the temperature at which a molten phase forms and below the melting point of silicon for a period of time sufficient to permit atoms of boron from said salt to be transported to the surface of said crystal and diffuse a sufficient distance therein in a sufficient quantity to effect the establishment of a diffused P–N junction, said diffusion taking place in a hydrogen atmosphere.

8. The method defined by claim 7 wherein the quantity of said salt is determined by the amount which will release quantity of hydrogen gas which produces a pressure of approximately one atmosphere within said tube at the upper limit of said temperature range.

9. The method of producing a P–P+ junction in a P-type silicon semiconductor crystal device to form an integral ohmic contact with said crystal by diffusing atoms of boron into said crystal including the steps of: placing the silicon crystal and $KBH_4$ salt into a quartz tube; evacuating said tube; sealing said tube from the atmosphere; and heating said tube to a value of temperature in the range of between 800° and 1250° C. and below the temperature at which a molten phase forms for a period of time sufficient to permit atoms of boron from said salt to be transported to the surface of said crystal to diffuse a sufficient distance therein in a sufficient quantity to effect the establishment of a diffused P–P+ junction, said diffusion taking place in a hydrogen atmosphere.

10. The method defined by claim 9 wherein the quantity of $KBH_4$ salt is determined by the amount which will release a quantity of hydrogen gas to produce a pressure of approximately one atmosphere within said tube at 1250° C.

11. The method of producing a P–N junction in an N-type silicon semiconductor electrical translating device by diffusing atoms of an acceptor impurity into an N-type conductivity silicon seimconductor crystal, said method including the steps of: placing the crystal and an acceptor impurity bearing compound selected from the group consisting of hydrides and hydride salts into a container; evacuating said container; sealing said container from the atmosphere; and heating said container to a value of temperature above the decomposition temperature of said compound and below the temperature at which a molten phase forms, and below the melting point of silicon to permit some of the acceptor impurity atoms to deposit upon and diffuse into said crystal in a reducing atmosphere produced by the release of hydrogen gas from said compound.

12. The method of producing an N–N+ junction in an N-type silicon semiconductor crystal device by diffusing atoms of a donor impurity into said crystal device to form an integral ohmic contact with said crystal including the steps of: placing the silicon crystal and a donor impurity bearing hydride salt into a quartz tube; evacuating said tube; sealing said tube from the atmosphere; and heating said tube to a value of temperature in the range of between 800° C. and 1250° C. and below the temperature at which a molten phase forms for a period of time sufficient to permit atoms of the donor impurity from said salt to be transported to the surface of said crystal to diffuse a sufficient distance therein in a sufficient quantity to effect the establishment of a diffused N–N+ junction, said diffusion taking place in a hydrogen atmosphere.

References Cited in the file of this patent

UNITED STATES PATENTS

| | | |
|---|---|---|
| 1,774,410 | Van Arkel | Aug. 26, 1930 |
| 2,307,005 | Ruben | Dec. 29, 1942 |
| 2,494,267 | Schlesinger et al. | Jan. 10, 1950 |
| 2,692,839 | Christensen et al. | Oct. 26, 1954 |
| 2,695,852 | Sparks | Nov. 30, 1954 |
| 2,701,216 | Seiler | Feb. 1, 1955 |
| 2,763,581 | Freedman | Sept. 18, 1956 |